(12) United States Patent  
Kojio et al.

(10) Patent No.: US 10,786,876 B2
(45) Date of Patent: Sep. 29, 2020

(54) MOUNTING METHOD OF A SEMICONDUCTOR DEVICE USING A COLORED AUXILIARY JOINING AGENT

(71) Applicant: Panasonic Intellectual Property Management Co., Ltd., Osaka (JP)

(72) Inventors: Teppei Kojio, Yamanashi (JP); Koji Motomura, Osaka (JP); Hiroki Maruo, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 329 days.

(21) Appl. No.: 15/962,899

(22) Filed: Apr. 25, 2018

(65) Prior Publication Data

US 2018/0236613 A1 Aug. 23, 2018

Related U.S. Application Data

(62) Division of application No. 14/403,156, filed as application No. PCT/JP2013/001788 on Mar. 15, 2013, now abandoned.

(51) Int. Cl.
*H01L 21/00* (2006.01)
*H01L 21/44* (2006.01)
(Continued)

(52) U.S. Cl.
CPC ........ *B23K 35/3612* (2013.01); *B23K 35/362* (2013.01); *B23K 35/365* (2013.01);
(Continued)

(58) Field of Classification Search
CPC ..... H01L 24/75; H01L 24/81; B23K 35/3612; B23K 35/362; B23K 35/365
See application file for complete search history.

(56) References Cited

U.S. PATENT DOCUMENTS 6,193,136 B1 2/2001 Higashi et al.
6,602,430 B1 * 8/2003 Nally ...................... B24B 21/04
134/1.3

(Continued)

FOREIGN PATENT DOCUMENTS

CN 101304835 A 11/2008
JP 60-149194 A 8/1985
(Continued)

OTHER PUBLICATIONS

U.S. Final Office Action dated Dec. 29, 2017 issued in U.S. Appl. No. 14/403,156.

(Continued)

*Primary Examiner* — Alonzo Chambliss
(74) *Attorney, Agent, or Firm* — McDermott Will & Emery LLP

(57) ABSTRACT

The purpose is, in mounting a semiconductor device onto a substrate, to make it easy to identify the remaining amount of an auxiliary joining agent, to stabilize the dispensing amount of the auxiliary joining agent, and to prevent a shortage of the auxiliary joining agent. Also for the purpose of efficient maintenance of a mounting machine, provided is an auxiliary joining agent adapted to aid joining of metals and prepared by dissolving a colorant in a solvent having a reducing property of removing an oxide film on a metal surface. The auxiliary joining agent is produced by a method including a step of mixing a solvent having a reducing property of removing an oxide film on a metal surface, and a colorant having a property of dissolving in the solvent.

6 Claims, 8 Drawing Sheets

(51) Int. Cl.
*H01L 23/48* (2006.01)
*B23K 35/36* (2006.01)
*H01L 23/00* (2006.01)
*B23K 35/365* (2006.01)
*B23K 35/362* (2006.01)
*H01L 23/31* (2006.01)

(52) U.S. Cl.
CPC .............. *H01L 24/75* (2013.01); *H01L 24/81* (2013.01); *H01L 23/3121* (2013.01); *H01L 24/13* (2013.01); *H01L 24/16* (2013.01); *H01L 2224/131* (2013.01); *H01L 2224/13144* (2013.01); *H01L 2224/13147* (2013.01); *H01L 2224/16225* (2013.01); *H01L 2224/16227* (2013.01); *H01L 2224/7501* (2013.01); *H01L 2224/759* (2013.01); *H01L 2224/75251* (2013.01); *H01L 2224/75252* (2013.01); *H01L 2224/75343* (2013.01); *H01L 2224/75349* (2013.01); *H01L 2224/75353* (2013.01); *H01L 2224/75701* (2013.01); *H01L 2224/75745* (2013.01); *H01L 2224/75753* (2013.01); *H01L 2224/75804* (2013.01); *H01L 2224/75822* (2013.01); *H01L 2224/75824* (2013.01); *H01L 2224/81002* (2013.01); *H01L 2224/81011* (2013.01); *H01L 2224/81022* (2013.01); *H01L 2224/81024* (2013.01); *H01L 2224/81055* (2013.01); *H01L 2224/81085* (2013.01); *H01L 2224/81132* (2013.01); *H01L 2224/81149* (2013.01); *H01L 2224/81191* (2013.01); *H01L 2224/81192* (2013.01); *H01L 2224/81203* (2013.01); *H01L 2224/81207* (2013.01); *H01L 2224/81447* (2013.01); *H01L 2224/81801* (2013.01); *H01L 2224/81912* (2013.01); *H01L 2224/81914* (2013.01); *H01L 2924/12041* (2013.01)

(56) References Cited

U.S. PATENT DOCUMENTS

| | | |
|---|---|---|
| 2001/0001469 A1 | 5/2001 | Higashi et al. |
| 2003/0219927 A1 | 11/2003 | Ryu et al. |
| 2003/0222964 A1 | 12/2003 | Brignone et al. |
| 2008/0205341 A1* | 8/2008 | Koh .................... H04L 65/1069 370/331 |
| 2008/0242798 A1 | 10/2008 | Wang et al. |
| 2009/0152331 A1 | 6/2009 | Schmitt et al. |
| 2010/0139952 A1 | 6/2010 | Arora et al. |
| 2012/0329182 A1 | 12/2012 | Kojio et al. |

FOREIGN PATENT DOCUMENTS

| | | |
|---|---|---|
| JP | 06-032988 A | 2/1994 |
| JP | H07-235763 A | 9/1995 |
| JP | H08-250846 A | 9/1996 |
| JP | 08-293665 A | 11/1996 |
| JP | 11-224981 A | 8/1999 |
| JP | 2000-068327 A | 3/2000 |
| JP | 2000-309739 A | 11/2000 |
| JP | 2001-237270 A | 8/2001 |
| JP | 2003-289088 A | 10/2003 |
| JP | 2003-332370 A | 11/2003 |
| WO | 2007/054198 A2 | 5/2007 |
| WO | 2008/085570 A2 | 7/2008 |
| WO | 2012/131817 A1 | 10/2012 |

OTHER PUBLICATIONS

U.S. Office Action dated Jul. 13, 2017 issued in U.S. Appl. No. 14/403,156.

International Search Report issued in International Patent Application No. PCT/JP2013/001788 dated Jun. 4, 2013 (with English translation).

Chinese Office Action dated Dec. 3, 2018 issued in Chinese Patent Application No. 201710299360.X (with partial English translation).

* cited by examiner

MOUNTING METHOD OF A SEMICONDUCTOR DEVICE USING A COLORED AUXILIARY JOINING AGENT

RELATED APPLICATIONS

This application is a Divisional Application of U.S. patent application Ser. No. 14/403, 156, filed on Nov. 21, 2014, which is a National Phase of International Patent Application No. PCT/JP2013/001788, filed on Mar. 15, 2013, which in turn claims the benefit of Japanese Application No. 2012-117328, filed on May 23, 2012, the disclosures of which applications are incorporated by reference herein.

TECHNICAL FIELD

The present invention relates to an auxiliary joining agent having a reducing property to aid joining of metals, and a method for producing the auxiliary joining agent.

BACKGROUND ART

As a mounting method of joining electrodes of a semiconductor device to electrodes of a substrate, a method is known in which Au bumps formed on the semiconductor device are pressed against Au electrodes formed on the substrate wiring, and in this state, ultrasonic vibration is applied to the contact interface, thereby to metal-join the Au bumps to the Au electrodes (see Patent Literatures 1 and 2).

To meet the demand for reducing the cost of semiconductor device-mounted substrates, a proposal is made to replace the expensive Au electrodes with inexpensive Cu electrodes. If the metal junction between Au and Cu or between Cu and Cu can have a similar level of reliability to that of the metal junction between Au and Au, considerable cost reduction would be realized while keeping the joint quality between the electrodes.

It is noted, however, that Cu is susceptible to oxidation, and its surface is usually coated with an oxide film. To improve the joint reliability of Au—Cu metal junction and of Cu—Cu metal junction, it is desirable to remove the oxide film beforehand from the surface of the Cu electrode in the joining process, and prevent the entry of metal oxide into the joint interface. The oxide film on the Cu electrode surface can be removed by, for example, applying plasma processing beforehand. However, even though the oxide film has been removed beforehand, the electrode surfaces at the joints will be oxidized by the heat applied thereto in the joining process. An effective way to prevent this is, for example, to dispense an auxiliary joining agent over first electrodes of the substrate, and press second electrodes of the semiconductor device against the first electrodes with the auxiliary joining agent therebetween, thereby to join the first electrodes and the second electrodes to each other. Here, in order to stabilize the joint reliability between the first and second electrodes, it is necessary to prevent the variations in the dispensing amount of auxiliary joining agent on the substrate and stabilize the dispensing amount.

CITATION LIST

Patent Literature

[PTL 1] Japanese Laid-Open Patent Publication No. 2000-68327
[PTL 2] Japanese Laid-Open Patent Publication No. 2001-237270

SUMMARY OF INVENTION

Technical Problem

However, materials available as the auxiliary joining agent are colorless and transparent, and the state of the auxiliary joining agent dispensed onto the substrate is difficult to see. It is therefore difficult to know the dispensing amount of auxiliary joining agent.

Moreover, a mounting machine does not always operate normally; usually, the stop and the restart of the machine are repeated due to an error such as a recognition error of the semiconductor device and the substrate and a supply error of the semiconductor device and the substrate. If the mounting machine stops, with the auxiliary joining agent dispensed onto the substrate as it is, and it takes a long time for recovery, the time interval from when the auxiliary joining agent is dispensed onto the substrate to when the semiconductor device is mounted becomes longer than usual. In such a case, the auxiliary joining agent will gradually volatilize from the substrate, and when it comes to mounting a semiconductor device, the amount of auxiliary joining agent may fall below the necessary level. However, since the auxiliary joining agent is colorless and transparent, the remaining amount thereof cannot be correctly identified, and it is difficult to determine whether or not the auxiliary joining agent needs to be re-dispensed.

Furthermore, the auxiliary joining agent having volatilized unexpectedly in a process other than the electrode joining process, if any, facilitates the corrosion of the metal components in the mounting machine or causes deterioration of the lubricant oil or grease applied to the operating parts, which may cause a failure of the mounting machine. Therefore, a periodic maintenance is necessary to clean the parts inside the mounting machine. However, since the auxiliary joining agent is colorless and transparent, the degree of contamination cannot be identified, and the timing of cleaning is difficult to determine. Moreover, the place contaminated with the auxiliary joining agent is difficult to check visually, and the unwiped auxiliary joining agent is likely to remain. The remaining auxiliary joining agent may cause a failure of the mounting machine.

The volatilization of auxiliary joining agent as mentioned above will be facilitated by various heat sources within the mounting machine. For example, in a mounting unit including a heating head for heating the semiconductor device, when the head comes in proximity to the substrate, the volatilization of auxiliary joining agent will be facilitated. Also when the substrate stage with the substrate held thereon is heated in mounting the semiconductor device, the volatilization of auxiliary joining agent will be facilitated. Particularly when the mounting machine is stopped by an error, with the auxiliary joining agent having been already applied to the substrate held on the substrate stage, a very large amount of auxiliary joining agent will volatilize because the substrate is kept heated during the time spent for recovery.

In view of the above, one purpose of the present invention is to make it easy to identify the amount of the auxiliary joining agent remaining on the substrate, thereby to stabilize the dispensing amount of auxiliary joining agent and prevent a semiconductor device from being mounted under the condition where the auxiliary joining agent is insufficient. Another purpose of the present invention is to make it easy to locate the place where the auxiliary joining agent adheres inside the mounting machine, thereby to allow the maintenance of the mounting machine to be performed efficiently.

Solution to Problem

The present invention is applicable to a mounting machine including: a substrate stage configured to hold a substrate having a first electrode, with the first electrode facing upward; a dispenser unit configured to dispense a colored auxiliary joining agent having a reducing property of removing an oxide film on a metal surface, onto the substrate held on the substrate stage, so as to cover the first electrode; a semiconductor device supply unit configured to supply a semiconductor device having a second electrode; and a mounting unit configured to mount the semiconductor device onto the substrate by pressing the second electrode of the semiconductor device supplied from the semiconductor device supply unit against the first electrode of the substrate which is held on the substrate stage and has the auxiliary joining agent dispensed on the first electrode, thereby to join the first electrode and the second electrode to each other.

The present invention is applicable to a mounting method including the steps of: (i) allowing a substrate having a first electrode to be held on a substrate stage, with the first electrode facing upward; (ii) dispensing a colored auxiliary joining agent having a reducing property of removing an oxide film on a metal surface, onto the substrate held on the substrate stage, so as to cover the first electrode; (iii) supplying a semiconductor device having a second electrode; and (iv) mounting the semiconductor device onto the substrate by pressing the second electrode of the supplied semiconductor device against the first electrode of the substrate which is held on the substrate stage and has the auxiliary joining agent dispensed on the first electrode, thereby to join the first electrode and the second electrode to each other.

In one embodiment of the aforementioned mounting method, the step (iv) includes a substrate recognition step of aligning the substrate and the semiconductor device with each other before mounting the semiconductor device onto the substrate, and a step of detecting a remaining amount of the auxiliary joining agent dispensed onto the substrate, at a timing of the substrate recognition. If the remaining amount of the auxiliary joining agent is judged as insufficient, the auxiliary joining agent is re-dispensed onto the substrate.

In another embodiment of the aforementioned mounting method, the step (ii) includes: dispensing the auxiliary joining agent onto at least one of the substrates so as to cover a plurality of the first electrodes corresponding to a plurality of the semiconductor devices; and the step (iv) includes mounting the plurality of the semiconductor devices onto the at least one of the substrates, while the corresponding first electrodes are covered with the auxiliary joining agent. Here, the step (iv) preferably includes a step of detecting a remaining amount of the auxiliary joining agent dispensed onto the substrate, every time when mounting of two or more selected from the plurality of the semiconductor devices is completed.

One aspect of the present invention relates to an auxiliary joining agent adapted to aid joining of metals, more specifically to a colored auxiliary joining agent having a reducing property of removing an oxide film on a metal surface. The auxiliary joining agent contains a solvent having a reducing property of removing an oxide film on a metal surface, and a colorant dissolved in the solvent.

Another aspect of the present invention relates to a production method of an auxiliary joining agent adapted to aid joining of metals, more specifically to a production method of a colored auxiliary joining agent having a reducing property of removing an oxide film on a metal surface. The method includes a step of mixing a solvent having a reducing property of removing an oxide film on a metal surface, and a colorant having a property of dissolving in the solvent.

Advantageous Effects of Invention

According to the present invention, since the auxiliary joining agent is colored, the amount of auxiliary joining agent existing on the substrate can be easily identified visually or using a recognition device (inspection unit) included in the mounting machine. It is therefore possible to easily stabilize the amount of the auxiliary joining agent dispensed onto the substrate, and thus to prevent a semiconductor device from being mounted under the condition where the auxiliary joining agent is insufficient. In addition, since the place where the auxiliary joining agent having volatilized unexpectedly adheres inside the mounting machine can be located easily, the maintenance of the mounting machine can be performed easily.

While the novel features of the invention are set forth particularly in the appended claims, the invention, both as to organization and content, will be better understood and appreciated, along with other objects and features thereof, from the following detailed description taken in conjunction with the drawings.

DESCRIPTION OF EMBODIMENTS

Figure 1:
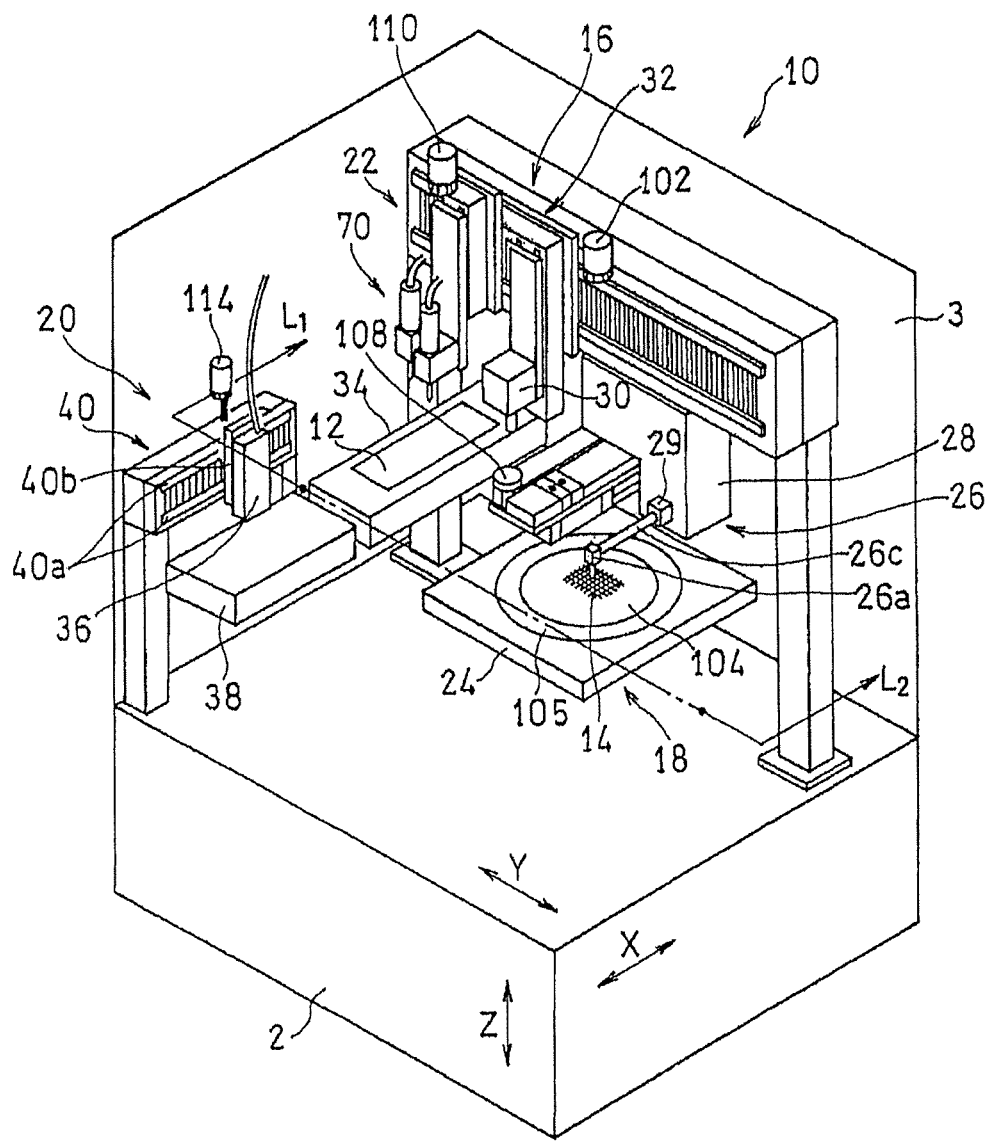
FIG. 1 A schematic oblique view of a mounting machine configured to mount a semiconductor device onto a substrate FIG. 2 A sectional side view of the mounting machine, taken along the line L1-L2 of FIG. 1

A mounting machine to which the present invention is applied is configured to mount a semiconductor device having a second electrode onto a substrate having a first electrode. The mounting machine includes: a substrate stage (first substrate stage) configured to hold a substrate having a first electrode, with the first electrode facing upward; and a dispenser unit configured to dispense a colored auxiliary joining agent having a reducing property of removing an oxide film on a metal surface, onto the substrate held on the substrate stage, so as to cover the first electrode.

Since the auxiliary joining agent is colored, the amount of auxiliary joining agent existing on the substrate can be easily identified visually or using a recognition device (inspection unit) included in the mounting machine. It is therefore possible to easily identify the amount of the auxiliary joining agent remaining on the substrate, as needed, and thus to stabilize the dispensing amount of auxiliary joining agent. For example, in a mounting machine including an inspection unit for detecting a remaining amount of the auxiliary joining agent dispensed onto the substrate, after the auxiliary joining agent is dispensed onto the substrate at the mounting position, the dispensing amount of auxiliary joining agent can be checked before mounting of the semiconductor device. In a mounting machine including a controller that controls the dispensing of the auxiliary joining agent by the dispenser unit, when the auxiliary joining agent is insufficient, the dispenser unit is controlled to dispense the auxiliary joining agent to fulfil the insufficiency. In that way, the dispensing amount of auxiliary joining agent is stabilized.

Moreover, even when the mounting machine fails to operate normally and stops due to an error, such as a recognition error of the semiconductor device and the substrate by various recognition cameras and a supply error of the semiconductor device and the substrate, and a long time has passed since the auxiliary joining agent had been dispensed onto the substrate, the amount of the auxiliary joining agent remaining on the substrate can be easily identified. When the auxiliary joining agent is judged as insufficient, the auxiliary joining agent can be re-dispensed. Therefore, it is highly unlikely that the semiconductor device is mounted under the condition where the auxiliary joining agent is insufficient.

Furthermore, when the auxiliary joining agent volatilizes in an unexpected stage and adheres to the inside of the mounting machine, the area where the auxiliary joining agent adheres will be colored. Therefore, the maintenance such as cleaning of the mounting machine can be easily performed. For example, by cleaning the colored area of the mounting machine at the end of the day's operation, a failure of the mounting machine due to gradual accumulation of the auxiliary joining agent can be prevented. Moreover, the timing of cleaning can be easily determined depending on the degree of coloration.

The mounting machine to which the present invention is applied includes: a semiconductor device supply unit configured to supply a semiconductor device having a second electrode; and a mounting unit configured to mount the semiconductor device onto the substrate by pressing the second electrode of the semiconductor device supplied from the semiconductor device supply unit against the first electrode of the substrate which is held on the substrate stage and has the auxiliary joining agent dispensed on the first electrode, thereby to join the first electrode and the second electrode to each other.

The semiconductor device supplied from the semiconductor device supply unit is held, for example, by a mounting tool included in the mounting unit, and in this state, the second electrode is pressed against the first electrode with a predetermined pressure. In this state, ultrasonic vibration or heat is applied to the semiconductor device from a mounting head through the mounting tool included in the mounting unit, and thus the second electrode of the semiconductor device forms a metal junction with the first electrode of the substrate. During the process of joining the first electrode and the second electrode to each other, the substrate is held on the first substrate stage.

The first substrate stage may include a heating means (first heating means) configured to heat the substrate. This facilitates the reduction action of the auxiliary joining agent and promotes the formation of the metal junction, and the mounting can be completed in a shorter time. Therefore, the production efficiency of mounted substrates can be improved. In addition, due to the shortened processing time, the formation of metal oxide at the joint can be suppressed. Therefore, the joint reliability can be improved. Furthermore, when the first substrate stage includes the first heating means, the substrate can be heated after the joining is finished, the excess auxiliary joining agent remaining after the joining can be quickly removed.

The mounting machine to which the present invention is applied can include an inspection unit configured to detect a remaining amount of the auxiliary joining agent dispensed onto the substrate. The remaining amount of auxiliary joining agent can be visually identified since the auxiliary joining agent is colored; however, in view of improving the efficiency of the mounting process, the remaining amount of auxiliary joining agent is preferably detected automatically by using an inspection unit.

The inspection unit is preferably configured to detect a remaining amount of the auxiliary joining agent dispensed onto the substrate, from the distribution state of the auxiliary joining agent remaining on the substrate. The inspection unit includes, for example, an image recognition camera that takes an image of the distribution state of the colored auxiliary joining agent remaining on the substrate. Since the size of the distribution area of auxiliary joining agent obtained by the image recognition camera is almost proportional to the remaining amount of auxiliary joining agent, the remaining amount can be detected from the distribution state of the auxiliary joining agent. Computation necessary for detecting the remaining amount can be done by a controller that controls the image recognition camera. The controller may include, for example, a central processor such as CPU and MPU, a volatile or nonvolatile memory, and various interfaces.

The mounting machine is typically equipped with a semiconductor device recognition camera and a substrate recognition camera used for aligning the substrate and the semiconductor device with each other in mounting the semiconductor device onto the substrate. The image recognition camera constituting the inspection unit may be common to the substrate recognition camera.

When the auxiliary joining agent is capable of emitting or absorbing at least one of infrared light and ultraviolet light, the inspection unit may be configured to detect a remaining amount of the auxiliary joining agent dispensed onto the substrate by utilizing the infrared light or ultraviolet light that the auxiliary joining agent emits or absorbs. Such an inspection unit includes, for example, an infrared light sensor, and an ultraviolet light sensor.

The detection by the inspection unit of the remaining amount of the auxiliary joining agent dispensed onto the substrate can be performed either before or after, or both before and after the semiconductor device is mounted onto the substrate. When the detection of the remaining amount of auxiliary joining agent is performed before the semiconductor device is mounted onto the substrate, the joining process is prevented from proceeding under the condition where the auxiliary joining agent is insufficient.

In the case of applying the auxiliary joining agent in advance at a plurality of mounting position on the substrate, and then mounting semiconductors device one after another at the mounting positions, the remaining amount of auxiliary joining agent may be detected upon completion of mounting of two or more (e.g., about 100) semiconductor devices. For example, a plurality of semiconductor devices are divided into a certain number of groups, and with respect to each group, the supply of the semiconductor device, the substrate recognition, and the mounting of the semiconductor device are repeated. Every time when the mounting of one group of semiconductor devices is completed, the remaining amount of auxiliary joining agent is detected. According to such a method, a plurality of semiconductor devices can be mounted onto the substrate without spending a lot of time for inspection of the remaining amount of auxiliary joining agent, and the efficiency of the mounting process can be improved. When the mounting of one group of semiconductor devices is completed, if the remaining amount of auxiliary joining agent is determined to be insufficient for covering the rest of the first electrodes, the auxiliary joining agent is re-dispensed so as to cover the rest of the first electrodes. Note that the timing of detecting the remaining amount of auxiliary joining agent is not limited to the above.

The auxiliary joining agent preferably has hue, chroma, and brightness that are visually recognizable. By using such an auxiliary joining agent, even when the auxiliary joining agent volatilizes and contaminates the inside of the mounting machine, the contaminated place can be easily identified visually. Therefore, the maintenance of the mounting machine can be easily and effectively performed. This, as a result, can reduce the probability of a failure of the mounting machine.

The mounting machine to which the present invention is applied may further include a plasma processing unit configured to apply plasma processing to the first electrode of the substrate before dispensing the auxiliary joining agent onto the substrate. In the mounting machine including the plasma processing unit, immediately after at least part of the oxide film is removed from the first electrode of the substrate, the second electrode of the semiconductor device can be joined to the first electrode. In that way, even when the first electrode includes Cu, which is susceptible to oxidation, the reproduction of oxide film on the first electrode can be prevented even though the mounting of the semiconductor device is performed in an ordinary atmosphere containing oxygen (e.g., in the air). Therefore, the joining process can performed, with little possible oxide film existing on the first electrode, and therefore, the joint reliability can be improved easily.

Another advantage of applying plasma processing to the first electrode of the substrate is that: the metal joining process proceeds, with almost no oxide film existing thereon, resulting in a shorter application time of ultrasonic waves or heat. Therefore, a new formation of metal oxide during the joining process can be further suppressed.

Removing the oxide film on the first electrode through plasma processing provides fine asperities on the surface of the first electrode. As a result, the wettability of the first electrode also becomes favorable, allowing the surface of the first electrode to be effectively covered with the auxiliary joining agent. This suppresses the contact of the first electrode with the oxygen in the air, and more efficiently suppresses the formation of metal oxide during the joining process.

The plasma processing unit may include a second substrate stage for holding the substrate during plasma processing to the first electrode. By this inclusion, for example, concurrently with removing the oxide film from one substrate through plasma processing on the second substrate stage, mounting of a semiconductor device on another plasma-processed substrate can be allowed to proceed on the first substrate stage. Therefore, the production efficiency of mounted substrates can be improved.

Furthermore, the mounting machine preferably includes a transfer mechanism configured to transfer the substrate from the second substrate stage to the first substrate stage. By this inclusion, it becomes easy to successively perform the plasma processing and the semiconductor device mounting process. Alternatively, upon completion of the plasma processing, the second substrate stage with the substrate held thereon may be moved directly to the position of the first substrate stage, and the mounting process may be performed.

Likewise, the mounting machine may include a second heating means configured to heat the second substrate stage. By this inclusion, the first electrode can be heated to a desired temperature while plasma processing to the first electrode. This can shorten the time needed for semiconductor device mounting, and the production efficiency of mounted substrates can be improved. Moreover, heating the substrate in advance with the second heating means can shorten the heating time with the first heating means.

One embodiment of the mounting unit included in the mounting machine includes an ultrasonic application means or ultrasonic head (mounting head) that presses the semiconductor device against the substrate and applies ultrasonic waves to the semiconductor device in joining the first electrode and the second electrode to each other. In the case of using an ultrasonic head, due to the friction between the electrodes, the temperature of the joint is locally increased, which facilitates the progress of metal joining. Moreover, since the temperature increases due to friction, the reduction action of the auxiliary joining agent is activated, preventing the formation of metal oxide at the joint. The ultrasonic head may further have a function of heating the semiconductor device by a method other than frictional heat.

One embodiment of the mounting unit included in the mounting machine includes a heating means or heating head (mounting head) that presses the semiconductor device against the substrate and applies heat to the semiconductor device in joining the first electrode and the second electrode to each other. The mounting unit including a heating head is suitable when at least one of the first and second electrodes has solder (low-melting metal). For example, it is desirable to use a heating head when the first electrode of the substrate is provided with precoat solder, or when the second electrode of the semiconductor device is provided with solder bumps. In this case, since the reduction action of the auxiliary joining agent is activated by the heat from the heating head, the oxide film on the solder surface can be removed, and the formation of metal oxide at the joint can be prevented.

The mounting method to which the present invention is applied includes the steps of: (i) allowing a substrate having a first electrode to be held on a substrate stage, with the first electrode facing upward; (ii) dispensing a colored auxiliary joining agent having a reducing property of removing an oxide film on a metal surface, onto the substrate held on the substrate stage, so as to cover the first electrode; (iii) supplying a semiconductor device having a second electrode; and (iv) mounting the semiconductor device onto the substrate by pressing the second electrode of the supplied semiconductor device against the first electrode of the substrate which is held on the substrate stage and has the auxiliary joining agent dispensed on the first electrode, thereby to join the first electrode and the second electrode to each other.

As described above, by joining the first and second electrodes to each other under the condition where the auxiliary joining agent is present at least around the joint interface between the first and second electrodes, the oxide film formed at the joint interface (contact interface) between the first and second electrodes is reduced, and the formation of new oxide films can be suppressed. This makes it possible to improve the joint reliability of Au—Cu metal junction and of Cu—Cu metal junction. Therefore, copper can be used as the electrode in place of expensive gold, and the production cost of substrates with semiconductor devices mounted thereon (mounted substrates) can be reduced.

As described above, the present invention is effective in improving the quality of metal-to-metal junction, and the effect is notable in such a case where the first electrode includes Cu (copper) and the second electrode includes Au (gold). In particular, the use of copper as the first electrode can realize a significant cost reduction. More specifically, the mounting machine and the mounting method of the present invention are suitably applicable when at least one of the first and second electrodes includes copper (Cu electrode or Cu-alloy electrode), and particularly suitably applicable when flip chip bonding is performed.

The above step (iv) typically includes a substrate recognition step of aligning the substrate and the semiconductor device with each other before mounting the semiconductor device onto the substrate. Such positional control is executed by, for example, a substrate recognition camera, and a controller for controlling the camera. Specifically, the substrate is photographed with a substrate recognition camera, and if the relative positional relationship between the substrate and the semiconductor device is not correct, the position of the substrate is adjusted using, for example, a moving mechanism for moving the first substrate stage.

As mentioned hereinbefore, the substrate recognition camera may be common to the image recognition camera constituting the inspection unit for detecting a remaining amount of auxiliary joining agent. Likewise, the controller for controlling the substrate recognition may be common to the controller for performing computation necessary for detecting a remaining amount of auxiliary joining agent. Typically, the control necessary for auxiliary joining agent detection and substrate recognition is executed by a controller configured to totally control the mounting machine.

The above step (ii) also may include a substrate recognition step of aligning the substrate with a dispensing means such as a dispenser for dispensing an auxiliary joining agent, before dispensing the auxiliary joining agent onto the substrate. Note that it suffices if the auxiliary joining agent is dispensed onto the substrate without performing such substrate recognition. Even though the dispensed position of the auxiliary joining agent is more or less deviated from the correct position, the positional deviation will be corrected because the auxiliary joining agent spreads over the first electrode on the substrate due to good wettability of the first electrode with the auxiliary joining agent. When plasma processing is applied to the first electrode before dispensing the auxiliary joining agent, particularly good spread of the auxiliary joining agent can be expected.

After the auxiliary joining agent is dispensed onto the substrate, a semiconductor device having a second electrode is supplied onto the substrate, and mounting of the semiconductor device is performed. Specifically, the semiconductor device is held by the mounting tool serving as a suction nozzle, and in this state, supplied onto the substrate. The position and angle of the semiconductor device held by the mounting tool are recognized with a specific device recognition camera, and fine adjustment is made, as necessary.

When detecting a remaining amount of the auxiliary joining agent dispensed onto the substrate, for more efficient mounting process, it is preferable to utilize the process of substrate recognition for aligning the substrate and the semiconductor device with each other. For example, in the case of mounting a plurality of semiconductor devices one after another at a plurality of mounting positions on one substrate, the auxiliary joining agent is dispensed first without performing substrate recognition, at a first dispensing position of auxiliary joining agent. Thereafter, the detection of a remaining amount of the auxiliary joining agent dispensed at the first dispensing position is performed together with the substrate recognition for aligning the substrate and the semiconductor device with each other, and then the semiconductor device is mounted on the substrate. Subsequently, the auxiliary joining agent is dispensed at a second dispensing position of auxiliary joining agent, without performing substrate recognition. Thereafter, the detection of a remaining amount of the auxiliary joining agent dispensed at the second dispensing position is performed together with the substrate recognition for aligning the substrate and the semiconductor device with each other, and then the semiconductor device is mounted on the substrate. After that, similar operations are repeated.

In the above step (ii), the auxiliary joining agent may be dispensed onto at least one substrate, so as to cover a plurality of the first electrodes corresponding to the plurality of the semiconductor devices. Thereafter, the semiconductor devices are mounted while the corresponding first electrodes are being covered with the auxiliary joining agent. In such a mounting method, the degree of volatilization of the auxiliary joining agent covering the corresponding first electrode will differ between at the semiconductor device to be mounted first after the auxiliary joining agent is dispensed and at the semiconductor device to be mounted last. Specifically, at the semiconductor device to be mounted later, the probability that the remaining amount of auxiliary joining agent will be insufficient becomes high. In such a case, the remaining amount of the auxiliary joining agent dispensed onto the substrate is detected every after completion of mounting of two or more, preferably 10 or more, and more preferably 50 or more semiconductor devices selected from the plurality of semiconductor devices. If the remaining amount of auxiliary joining agent is determined to be insufficient for covering the rest of the first electrodes, the auxiliary joining agent is re-dispensed.

The present invention is particularly effective when at least one selected from the first and second electrodes includes Cu. This is because, since Cu is inexpensive and low in resistance but is susceptible to oxidation, it is desirable to join the electrodes while there is no shortage in the auxiliary joining agent. Moreover, since Cu is susceptible to oxidation, in the case of employing an electrode including Cu, it is desirable to apply plasma processing to the Cu-including electrode before dispensing the auxiliary joining agent onto the substrate.

The auxiliary joining agent of the present invention will now be described.

The auxiliary joining agent according to the present invention is a colored material having a reducing property of removing an oxide film on a metal surface. The auxiliary joining agent includes a solvent having a reducing property of removing an oxide film on a metal surface, and a colorant dissolved in the solvent. The solvent having a reducing property by itself is colorless and transparent. By dissolving a colorant in the solvent, a colored auxiliary joining agent can be obtained.

The colorant dissolved in the solvent volatilizes along with the solvent. Therefore, when the auxiliary joining agent is completely volatilized from the substrate after the completion of mounting, no colorant will be left on the substrate, and the substrate will not be tinted to an unintended color. At the places in the mounting machine where the volatilized auxiliary joining agent adheres, the colorant adheres together with the auxiliary joining agent. Therefore, by cleaning the colored places to an extent that the colorant is removed, almost all of the auxiliary joining agent will be removed. In that way, the maintenance of the mounting machine can be simplified.

The auxiliary joining agent preferably has hue, chroma, and brightness that are visually recognizable. Such color allows the presence of auxiliary joining agent to be visually checked, without using a spectroscopic analyzer. It is therefore advantageous for identifying the remaining amount of the auxiliary joining agent dispensed onto the substrate and for the maintenance work.

The colorant preferably has a property of volatilizing along with the solvent through azeotropic phenomenon. The colorant having such property is particularly unlikely to be left on the substrate, and the probability that the substrate is tinted to an unintended color is reduced. Therefore, mounted substrates with clean appearance can be obtained. Note that in the case of an ink used for printers and the like, it is required that only the solvent be volatilized, leaving the colorant to deposit on the ink applied surface. Accordingly, the colorant of the ink need not be completely dissolved in the solvent. In other words, the characteristics of the auxiliary joining agent of the present invention are opposite to those of the ink.

The solvent has a boiling point Tb, the colorant has a melting point Tm, and Tb and Tm preferably satisfy Tb>Tm. In the case where such relationship is satisfied, when dissolving the colorant in the solvent, for facilitating the dissolution, the mixture of the solvent and the colorant can be heated at a temperature equal to or higher than the melting point Tm of the colorant and lower than the boiling point Tb of the solvent. Therefore, it becomes easy to prepare a colored auxiliary joining agent. Moreover, when Tb>Tm, azeotropic phenomenon is likely to occur, lowering the probability that the colorant is left on the substrate. When the colorant has a boiling point Tbc, the boiling point Tb of the solvent and the boiling point Tbc of the colorant preferably satisfy Tb>Tbc.

The auxiliary joining agent has a viscosity at 25° C. preferably of 0.1 to 10 Pa·s, and more preferably of 1 to 5 Pa·s. With the viscosity in the range as above, the auxiliary joining agent is easy to handle and easy to dispense onto the substrate using a dispenser or the like. Furthermore, the auxiliary joining agent with the above viscosity, when dispensed onto the substrate, readily spreads over the first electrode and is likely to stay at a desired position on the substrate.

A preferable amount of the colorant contained in the auxiliary joining agent is dependent on the type of the solvent and the colorant and not particularly limited, but is preferably 0.01 to 50 mass %, and more preferably 1 to 10 mass %. Increasing the amount of colorant tends to increase the viscosity of auxiliary joining agent. Decreasing the amount of colorant lowers the viscosity, but tends to dilute the color.

The colorant is not particularly limited, but is preferably an organic coloring matter, and particularly preferably an oil-soluble dye. It is also preferable that the colorant itself has volatility. The colorant is, for example, at least one selected from the group consisting of azo compounds (particularly, disazo compounds), cyanine compounds, and styryl compounds. Preferable examples of the azo compounds include Solvent Yellow 56 and Solvent Red 27, because they are highly soluble in a solvent and volatilize along with the solvent. Preferable examples of the cyanine compounds include anthocyanin, merocyanine, and rhodacyanine. Preferable examples of the styryl compounds include styryl phenol. These may be used singly or as a mixture of two or more. The colorant is not limited to the one that shows absorption and emission of light in the visible light region which can be visually recognized, and may be one that shows absorption and emission of light in the infrared region or ultraviolet region. The absorption and emission of light in the latter region can be detected by, for example, using an infrared sensor or an ultraviolet sensor.

In view of, for example, performing encapsulating process (FIG. 6E) reliably in the later process, the solvent is preferably a volatile solvent, and particularly preferably a protonic solvent. This is because a protonic solvent is highly capable of removing an oxide film on a metal surface, and the reliability of metal-to-metal joints can be easily ensured. The protonic solvent is, for example, at least one selected from the group consisting of alcohols and organic acids.

The alcohol is preferably a multi-functional alcohol having a molecular weight of 50 to 200. Specific examples thereof include at least one selected from the group consisting of glycerin, ethylene glycol, propylene glycol, diethylene glycol, triethylene glycol, tetraethylene glycol, carbitol, and cellosolve alcohol. The organic acid is, for example, a formic acid, an acetic acid, or a benzoic acid. An alkane or an amine compound which is not protonic may also be used. Examples of the alkane include decane and tetradecane. Examples of the amine compound include formamide and dimethylformamide. An alkyl ether of a multi-functional alcohol may also be used. Specific examples thereof include diethylene glycol mono-n-butyl ether, and trienthylene glycol dimethyl ether. These may be used singly or as a mixture of two or more. Water may be used as part of the protonic solvent.

The auxiliary joining agent as mentioned above can be produced by, for example, simply mixing a solvent having a reducing property, and a colorant soluble in the solvent. By simultaneously heating the solvent and the colorant mixed together at a temperature lower than the boiling point Tb of the solvent and equal to or higher than the melting point Tm of the colorant, the auxiliary joining agent can be produced more quickly. Furthermore, to facilitate the dissolution of the colorant, an amphiphilic substance (surfactant) with respect to the solvent and the colorant may be contained in the mixture of the solvent and the colorant.

For example, a mixture of glycerin (solvent, boiling point: 290° C.) and Solvent Yellow 56 (colorant, melting point: 93 to 95° C.), which is available as the auxiliary joining agent, can be prepared by placing glycerin in a container for preparation, directly adding a predetermined amount of Solvent Yellow 56 thereinto, and stirring a mixture in the container. While stirring, the mixture may be heated at 95 to 100° C. Stirring until Solvent Yellow 56 is completely dissolved gives a colored auxiliary joining agent. The auxiliary joining agent is cooled to room temperature, if necessary, and stored, for example, in an airtight container.

The auxiliary joining agent may further include an additive such as a plasticizer, an antistat, a viscosity modifier, a surface tension modifier, and an antifoamer, as necessary. Note that the auxiliary joining agent preferably includes no filler (e.g., ceramics such as an inorganic oxide).

Meanwhile, for reduction in size of the machine or more efficient utilization of the internal space of the housing, the semiconductor device supply unit preferably includes a semiconductor device placement portion configured to support a plurality of semiconductor devices and disposed below the first substrate stage. In this case, the semiconductor device supply unit preferably includes an upward moving mechanism configured to pick up the semiconductor device from the device placement portion, and moves the device upward to be delivered to the mounting head such as an ultrasonic head or heating head. The upward moving mechanism preferably includes an axial portion one end of which has a rotation center portion and the other end of which has a device holding portion, and a rotating mechanism configured to half-rotate the axial portion holding a semiconductor device at the device holding portion, using the rotation center portion.

In the configuration above, a plurality of semiconductor devices are placed on the device placement portion, with, for example, the second electrodes facing upward. By the motion of the rotating mechanism of the upward moving mechanism, the semiconductor device is turned upside down and delivered to the mounting head. The mounting head receives the semiconductor device, with the second electrodes facing downward. Thus, the semiconductor device can be easily flip-chip bonded onto the substrate which is held on the first substrate stage with the first electrode facing upward. As described above, since the upward moving mechanism includes the rotating mechanism, the semiconductor device can be sucked up at opposite surfaces when picked up by the upward moving mechanism and when held by the mounting head. This realizes smooth delivery of the semiconductor device.

When the second electrode is ultrasonically joined to the first electrode, the substrate is preferably heated to 80 to 150° C. on the first substrate stage. By heating the substrate to 80° C. or higher, the time of the ultrasonic joining can be shortened, and the existence of oxide at the joint interface between the electrodes can be suppressed. This can improve the joint reliability between the electrodes. Heating the substrate can facilitate the reduction effect of the auxiliary joining agent. Setting the upper limit of the heating to 150° C. is advantageous in that, when using an auxiliary joining agent including a solvent having a boiling point of 200° C. or more, the auxiliary joining agent can be prevented from being quickly and completely volatilized during the mounting process.

When plasma processing is applied to the first electrode, the substrate is preferably heated to 50 to 100° C. on the second substrate stage. By heating the substrate to such a temperature, the substrate can be sufficiently pre-heated during the removal of an oxide film, leading to further improvement in production efficiency.

In joining the second electrode to the first electrode, the ultrasonic head or heating head, or the mounting tool is preferably heated to 200 to 300° C. This can shorten the time of the joining process, and improve the joint reliability between the electrodes. Moreover, since the second electrode is softened by heat, the load or the intensity of ultrasonic waves necessary for mounting can be set lower. Therefore, the damage to each electrode can be decreased.

Furthermore, in the production method of the present invention, the second electrode is joined to the first electrode preferably in ordinary atmosphere. This is because realization of a hypoxic atmosphere such as $N_2$ atmosphere increases the cost. According to the present invention, even in ordinary atmosphere, the formation of metal oxide between the electrodes during joining can be suppressed.

In the following, embodiments to which the present invention is applied will be specifically described with reference to the drawings.

Embodiment 1

Figure 2:
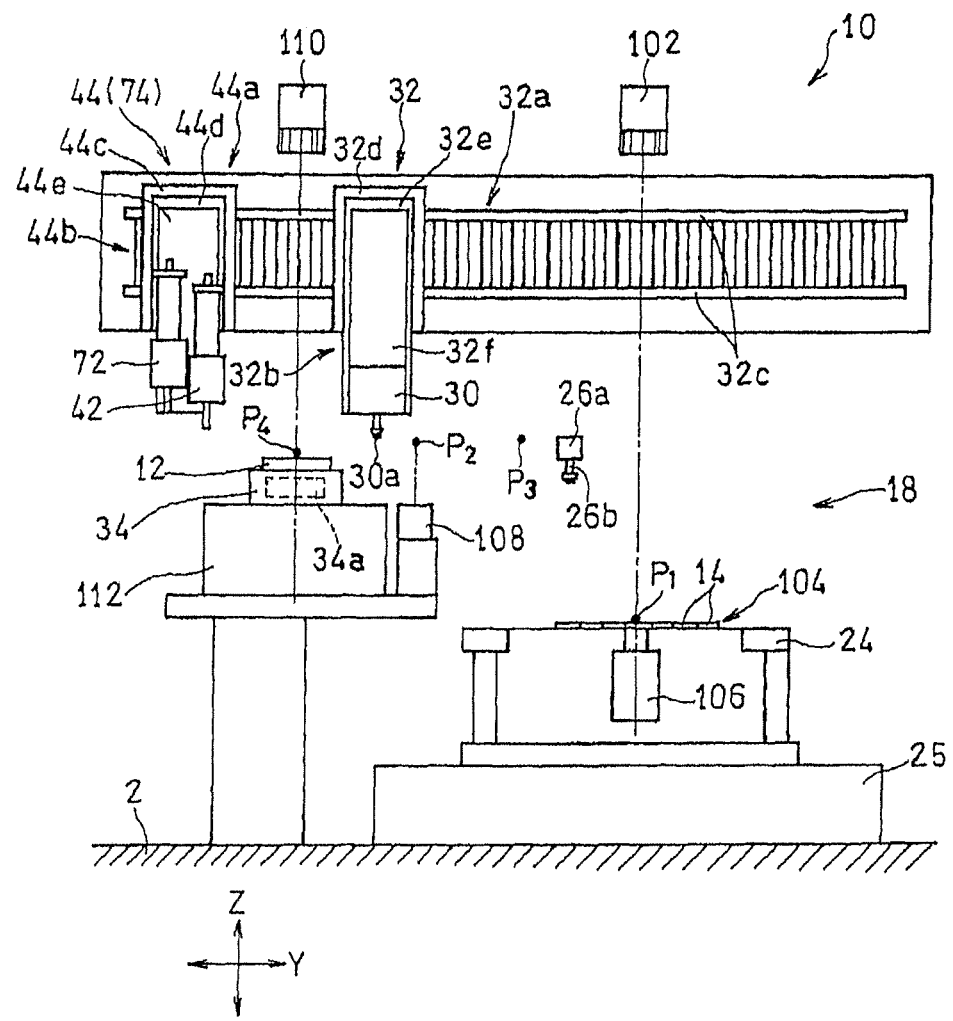
Figure 3:
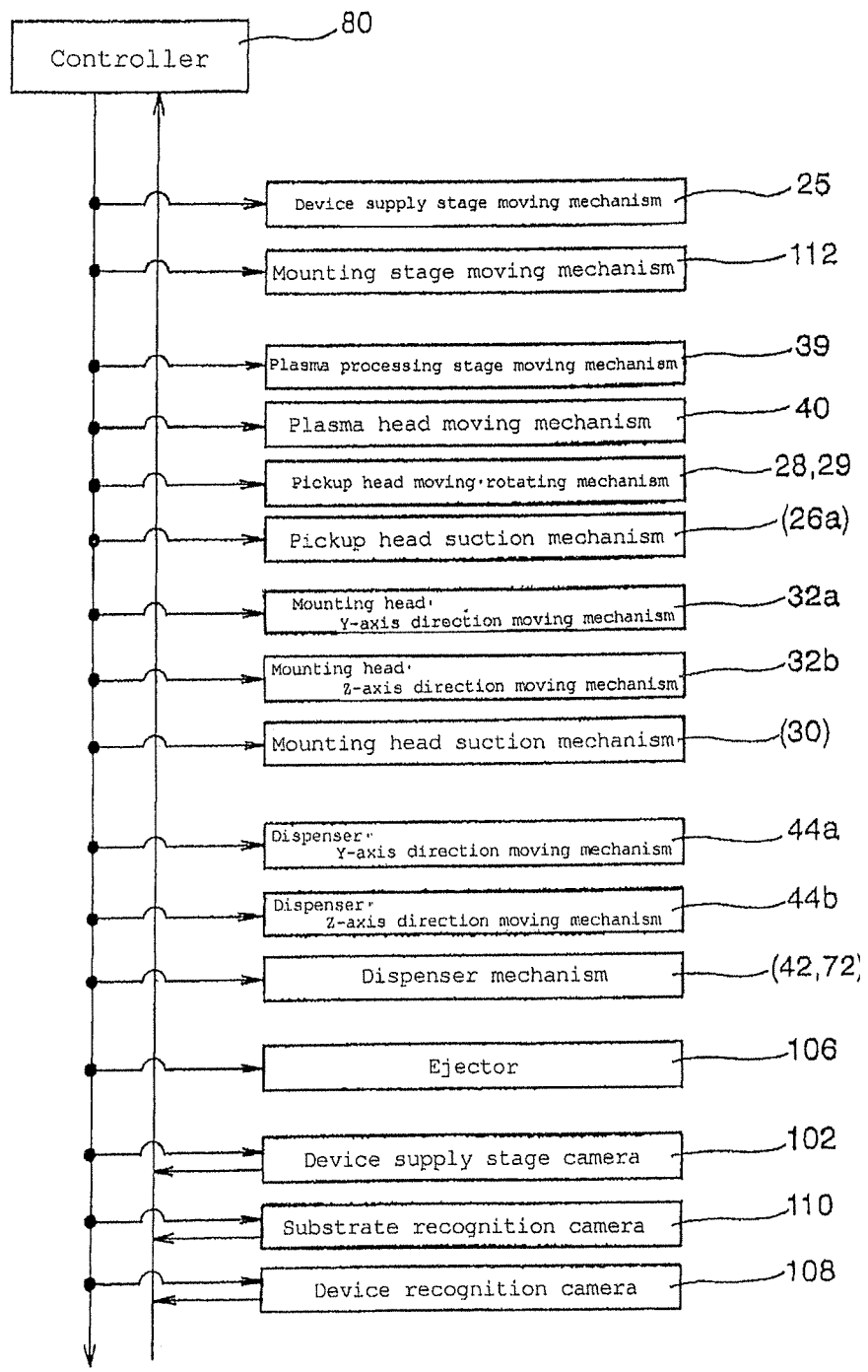
FIG. 3 A block diagram of a control system of the mounting machine
Figure 4:
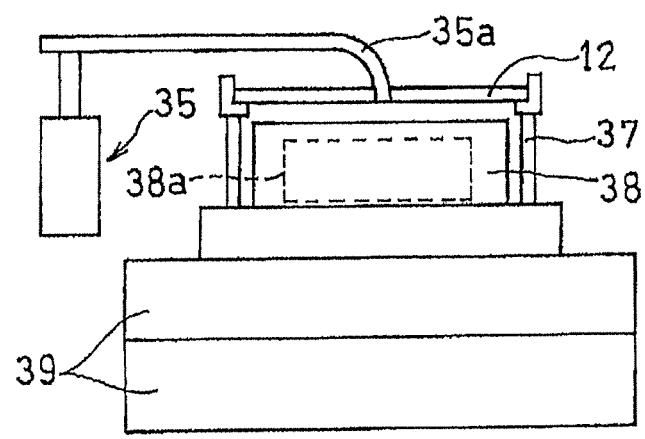
FIG. 4 A partial front view of the mounting machine, detailing a substrate transfer mechanism FIG. 5 A flowchart of procedures for mounting semiconductor devices using the mounting machine FIG. 6A An explanatory view of a step in the flowchart of FIG. 5, illustrating a cross section of a substrate before subjected to an oxide film removal process FIG. 6B An explanatory view of a step in the flowchart of FIG. 5, illustrating a cross section of the substrate after subjected to the oxide film removal process and an auxiliary joining agent dispensing process FIG. 6C An explanatory view of a step in the flowchart of FIG. 5, illustrating a cross section of the substrate and a semiconductor device in the state in which electrodes of the semiconductor device are brought into contact with electrodes of the substrate after the auxiliary joining agent dispensing process FIG. 6D An explanatory view of a step in the flowchart of FIG. 5, illustrating a cross section of the substrate and the semiconductor device in the state in which the auxiliary joining agent is removed after the electrodes of the semiconductor device are joined to the electrodes of the substrate FIG. 6E An explanatory view of a step in the flowchart of FIG. 5, illustrating a cross section of a mounted substrate in the state in which the semiconductor device is encapsulated with resin after the auxiliary joining agent is removed FIG. 7 A flowchart of another procedure for mounting semiconductor devices using the mounting machine

FIG. 1 is an oblique view of one embodiment of a mounting machine configured to mount a semiconductor device onto a substrate. FIG. 2 is a sectional side view of the mounting machine of FIG. 1. FIG. 3 is a block diagram of a control system of the mounting machine. FIG. 4 schematically illustrates a transfer mechanism for transferring a substrate.

A mounting machine 10 illustrated in the figure is for mounting a semiconductor device 14 onto a substrate 12, and structured as a flip chip bonder for flip-chip mounting the semiconductor device 14, for example, a light emitting diode, onto the substrate 12. The mounting machine 10 includes one pedestal 2, and the pedestal 2 supports all units mentioned below.

The mounting machine 10 is an independent machine including one housing 3 in which all the above-mentioned units are incorporated. In FIG. 1, for ease of understanding of the internal structure of the mounting machine 10, the housing 3 is partially shown. In the figure, the X-axis direction indicates the front/rear direction of the mounting machine 10, the Y-axis direction indicates the left/right direction of the mounting machine 10, and the Z-axis direction indicates the vertical up/down direction.

The mounting machine 10 includes: a mounting unit 16 for ultrasonically joining an electrode (bump) 14a (second electrode) of the semiconductor device 14 onto an electrode 12a (first electrode, see FIG. 6A etc.) of the substrate 12; a semiconductor device supply unit 18 for supplying the semiconductor device 14 which is to be mounted onto the substrate 12; a plasma processing unit 20 for applying plasma to the electrode 12a of the substrate 12, thereby to remove an oxide film on the electrode 12a; a dispenser unit 22 for dispensing a colored auxiliary joining agent having a reducing property of removing an oxide film on a metal surface; a resin encapsulating unit 70; and a controller 80. The controller 80 is not shown in FIG. 1, and shown only in FIG. 3 illustrating a control system of the mounting machine 10.

The semiconductor device supply unit 18 includes a device supply stage 24 (device placement portion) disposed movably in the horizontal direction (X- and Y-axis direction), a device supply stage moving mechanism 25, and a device pickup unit 26. The semiconductor device supply unit 18 further includes a device supply stage camera 102 and an ejector 106.

On the top surface of the device supply stage 24, a wafer 104 including a plurality of the semiconductor devices 14 and attached to a sheet-like member 105 is placed, with the bumps 14a facing upward. The device supply stage moving mechanism 25 is composed of, for example, an XY table. The optical axis of the device supply stage camera 102 intersects on the device supply stage 24 with a position (hereinafter referred to as "device pickup position P1") where the semiconductor device 14 is to be picked up by the device pickup unit 26.

The ejector 106 is disposed below the device pickup position P1, and operates so as to push the semiconductor device 14 to be picked up by the device pickup unit 26, upward from the wafer 104.

The device pickup unit 26 includes a pickup head 26a, a pickup tool 26b, an arm 26c supporting the pickup head 26a, a pickup head moving mechanism 28, and a pickup head rotating mechanism 29.

The pickup tool 26b has an axial portion, and one end of the axial portion thereof serves as, for example, an opening of a suction nozzle for picking up one semiconductor device 14 from the device supply stage 24. The other end of the pickup tool 26b is connected to the pickup head 26a.

The pickup head 26a is connected to one end of the horizontally-extending long-axial aim 26c. The other end of the arm 26c is connected to the pickup head moving mechanism 28 and the pickup head rotating mechanism 29. The pickup head moving mechanism 28 includes a Y- and Z-axis direction moving mechanism (not shown), and moves the pickup head 26a in the Y-axis direction and Z-axis direction within a predetermined range.

The pickup head rotating mechanism 29 allows the arm 26c to turn by 180° (half-rotate), with its axis at the center of rotation. The pickup tool 26b is attached to the pickup head 26a such that the axial portion is orthogonal to the extending direction of the aim 26c. The half-rotation of the aim 26c allows the pickup tool 26b to move between the state with the tip end facing upward and that with the tip end facing downward. Thus the semiconductor device 14 held by the pickup tool 26b is flipped over so that its top side faces down. The semiconductor device 14 to be picked up by the pickup tool 26b is selected by the movement of the device supply stage 24 in the X- and Y-axis direction and is pushed up from the wafer 104 by the ejector 106.

The mounting unit 16 includes a mounting head 30, a mounting tool 30a attached to the mounting head 30 and configured to hold the semiconductor device 14, a mounting head moving mechanism 32 for moving the mounting head 30, a mounting stage (first substrate stage) 34 for holding the substrate 12 while joining the bump 14a of the semiconductor device 14 to the electrode 12a of the substrate 12, and a mounting stage moving mechanism 112 (e.g., XY table). The mounting unit 16 further includes a device recognition camera 108 and a substrate recognition camera 110. The mounting head moving mechanism 32 includes a Y-axis direction moving mechanism 32a for moving the mounting head 30 in the Y-axis direction, and a Z-axis direction moving mechanism 32b for moving the mounting head 30 in the Z-axis direction.

The mounting head 30 may be an ultrasonic head including a known ultrasonic oscillator, pressurizing means, transducer, or ultrasonic horn, or may be a heating head including a specific heating device or pressurizing means. The heating tool 30a includes, for example, a suction nozzle that sucks up and holds the semiconductor device 14. The device recognition camera 108, at a device recognition position P2 thereabove, takes the image of the semiconductor device 14 held by the mounting tool 30a and recognizes the posture thereof. If the posture is displaced from a predetermined posture, the displacement is corrected by, for example, a rotation of the mounting tool 30a.

The substrate recognition camera 110 takes images of the electrode 12a of the substrate 12, the alignment mark, and the like, to recognize a mounting position P4 of the semiconductor device 14 on the substrate 12. In taking images, the mounting stage (first substrate stage) 34 is moved to an appropriate position within the X-Y plane by the mounting stage moving mechanism 112. The controller 80, on the basis of the recognized mounting position P4, determines the positions of the electrode 12a and the corresponding bump 14a so that they can be joined to each other, and instructs the mounting stage moving mechanism 112 to move the mounting stage 34. In correspondence therewith, the controller 80, on the basis of the reception result of the device recognition camera 108, instructs the mounting head moving mechanism 32 to move the mounting head 30.

In this embodiment, the substrate recognition camera 110 functions also as an inspection unit for detecting a remaining amount of the auxiliary joining agent dispensed onto the substrate 12. Specifically, the images of the substrate 12 taken by the substrate recognition camera 110 for recognizing the mounting position P4 include an image of the distribution state of the colored auxiliary joining agent supplied onto the substrate 12. From the distribution state (e.g., distribution area) of the auxiliary joining agent, the controller 80 can determine a remaining amount of auxiliary joining agent. Since the auxiliary joining agent is colored, the image of the distribution state of the auxiliary joining agent can be clearly recognized. Therefore, regardless of the performance of the substrate recognition camera 110, the remaining amount of auxiliary joining agent can be comparatively accurately calculated.

The Y-axis direction moving mechanism 32a of the mounting head moving mechanism 32 includes two Y-axis rails 32c extending in the Y-axis direction, and a Y-axis slider 32d, which is a movable element of a linear motor. The Z-axis direction moving mechanism 32b includes an elevating mechanism 32e attached to the Y-axis slider 32d, and a mounting head support plate 32f to be vertically moved by the elevating mechanism 32e. The mounting head 30 is attached to the lower end of the mounting head support plate 32f.

The controller 80 instructs the mounting head moving mechanism 32 to position the mounting head 30 such that the delivery of the semiconductor device 14 from the device pickup unit 26 to the mounting head 30 can be performed at a predetermined delivery position P3, and the imaging of the semiconductor device 14 by the device recognition camera 108 can be performed at the device recognition position P2. The mounting stage 34 incorporates a heater 34a serving as a heating means, by which the substrate 12 is heated to a predetermined temperature (e.g., to 80 to 150° C.)

The plasma processing unit 20 includes a plasma head 36 that generates atmospheric pressure plasma for removing an oxide film from the electrode 12a of the substrate 12, a plasma processing stage 38 (second substrate stage) for holding the substrate 12 during plasma processing of the electrode 12a, a plasma head moving mechanism 40, a substrate recognition camera 114, and a plasma processing stage moving mechanism 39 (see FIG. 4). The plasma head 36 includes a known atmospheric pressure plasma generating mechanism that generates atmospheric pressure plasma using high pressure air or the like.

The plasma head moving mechanism 40 includes two X-axis rails 40a extending in the X-axis direction, and an X-axis slider 40b, which is a movable element of the linear motor. The plasma head 36 is directly attached to the X-axis slider 40b.

The dispenser unit 22 includes an auxiliary joining agent dispending head (dispenser) 42 for dispensing and applying a colored auxiliary joining agent to the electrode 12a of the substrate 12, and an auxiliary joining agent dispending head moving mechanism 44. The auxiliary joining agent dispending head moving mechanism 44 includes a Y-axis direction moving mechanism 44a and a Z-axis direction moving mechanism 44b. The Y-axis direction moving mechanism 44a includes the aforementioned Y-axis rails 32c, and a Y-axis slider 44c, which is a movable element of the linear motor. The Z-axis direction moving mechanism 44b includes an elevating mechanism 44d attached to the Y-axis slider 44c; and an auxiliary joining agent dispending head support plate 44e to be vertically moved by the elevating mechanism 44d. The auxiliary joining agent dispensing head 42 is attached to the lower end of the auxiliary joining agent dispending head support plate 44e. After the positioning of the auxiliary joining agent dispending position (substrate recognition) is performed by using the substrate recognition camera 110, the auxiliary joining agent dispending head (dispenser) 42 dispenses and applies a colored auxiliary joining agent, as necessary, to the electrode 12a of the substrate 12.

The resin encapsulating unit 70 includes a resin dispensing head (dispenser) 72 for dispensing a resin for encapsulation, and a resin dispensing head moving mechanism 74. The resin dispensing head 72 is attached, together with the auxiliary joining agent dispensing head 42, on the auxiliary joining agent dispensing head support plate 44e. Therefore, the resin dispensing head moving mechanism 74 includes the Y-axis direction moving mechanism 44a and the Z-axis direction moving mechanism 44b which are common to the auxiliary joining agent dispending head moving mechanism 44.

FIG. 3 is a block diagram of a control system of the mounting machine. As shown in FIG. 3, the controller 80 included in the mounting machine 10 controls the operation of the device supply stage moving mechanism 25 to move the device supply stage 24 in the X-axis direction and Y-axis direction (in the horizontal direction) with respect to the pedestal 2. The controller 80 controls the operation of the mounting stage moving mechanism 112 to move the mounting stage 34 in the horizontal direction with respect to the pedestal 2. The controller 80 controls the operation of the plasma processing stage moving mechanism 39 to move the plasma processing stage 38 in the horizontal direction with respect to the pedestal 2. The controller 80 controls the operation of the plasma head moving mechanism 40 to move the plasma head 36 in the X-axis direction.

The controller 80 controls the operation of the pickup head moving mechanism 28 and the pickup head rotating mechanism 29 to move the pickup head 26a in the Y-axis direction and Z-axis direction and rotate it about the X axis. The controller 80 controls the operation of a pickup head suction mechanism (not shown) to suck up the semiconductor device 14 with the pickup tool 26b.

The controller 80 controls the operation of the Y-axis direction moving mechanism 32a and the Z-axis direction moving mechanism 32b of the mounting head moving mechanism 32 to move the mounting head 30 in the Y-axis direction and Z-axis direction. The controller 80 controls the operation of a mounting head suction mechanism (not shown) to operate the mounting tool 30a to suck up the semiconductor device 14.

The controller 80 controls the operation of the Y-axis direction moving mechanism 44a and the Z-axis direction moving mechanism 44b of the auxiliary joining agent dispending head (dispenser) moving mechanism 44 to move the auxiliary joining agent dispending head 42 and the resin dispensing head 72 in the Y-axis direction and Z-axis direction. The controller 80 controls the operation of a dispenser mechanism (not shown) to dispense the auxiliary joining agent from the auxiliary joining agent dispending head 42, and dispense the resin from the resin dispensing head 72.

The controller 80 drives the ejector 106 to push up the semiconductor device 14 at the device pickup position P1.

The controller 80 controls the operation of the device supply stage camera 102 to perform imaging of a predetermined region including the device pickup position P1. The controller 80 controls the operation of the substrate recognition camera 110 to perform imaging of a predetermined region including the mounting position P4. Furthermore, the controller 80 analyzes the image taken at a necessary timing, and calculates the remaining amount of auxiliary joining agent from the distribution state thereof. When the remaining amount is insufficient, the auxiliary joining agent dispending head 42 is operated to re-dispense the auxiliary joining agent onto the substrate 12. In addition, the controller 80 controls the operation of the device recognition camera 108 to perform imaging of a predetermined region including the device recognition position P2. The images obtained by the above imaging operations are input into the controller 80.

Figure 5:
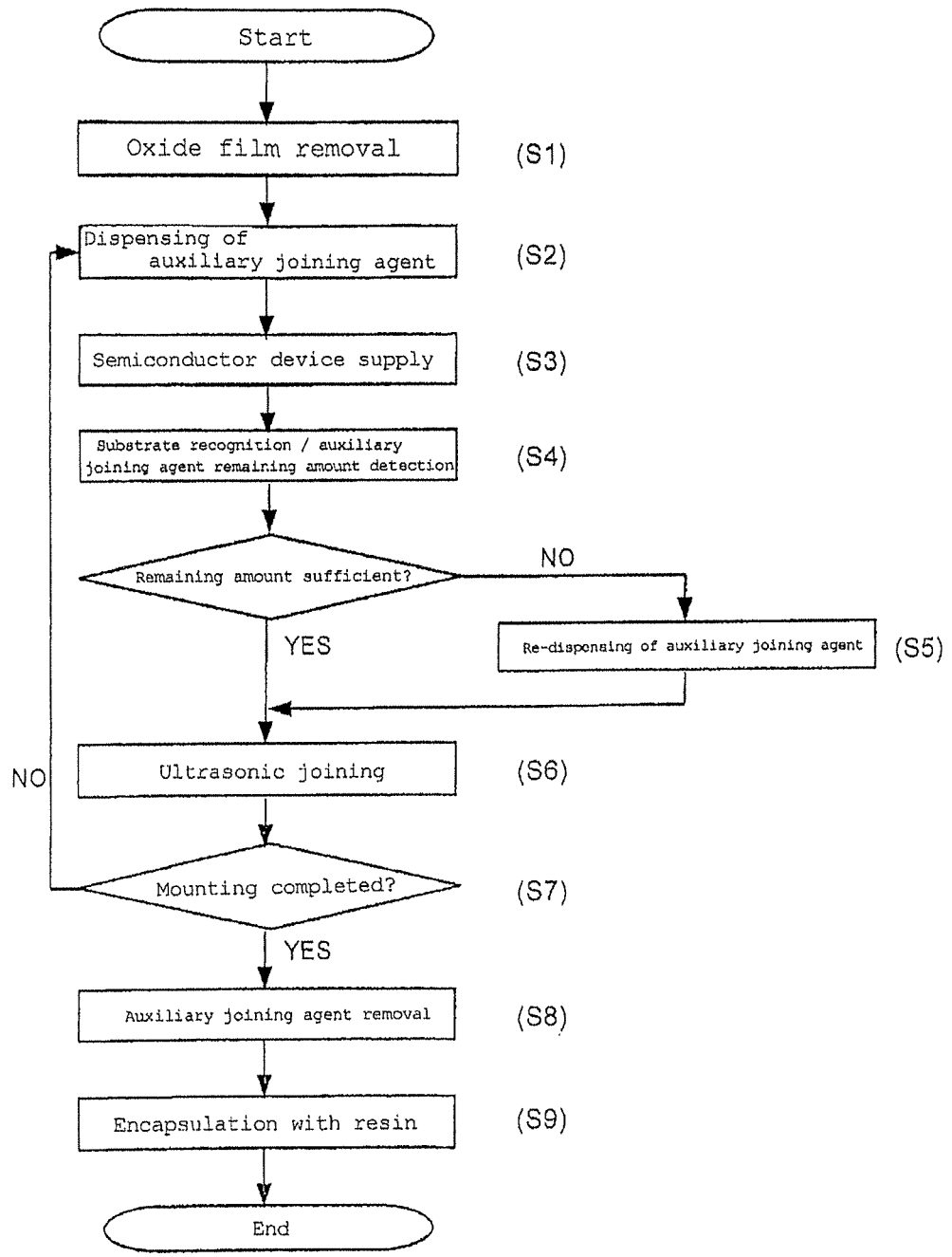

In the following, the procedures for mounting the semiconductor device 14 onto the substrate 12 using the mounting machine 10 of FIG. 1 are described, with reference to the flowchart of FIG. 5 and illustrative drawings of FIGS. 6A to 6E.

Figure 6A:
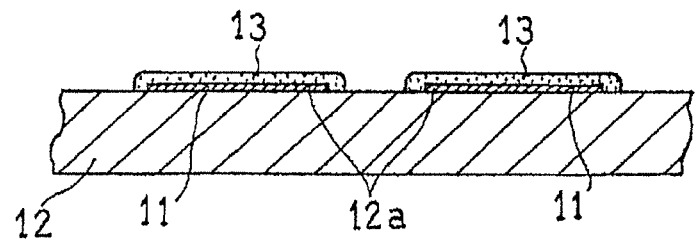
Figure 6B:
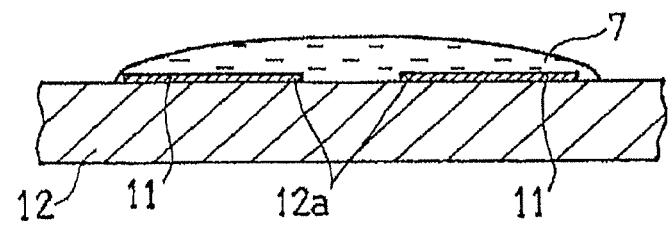
Figure 6C:
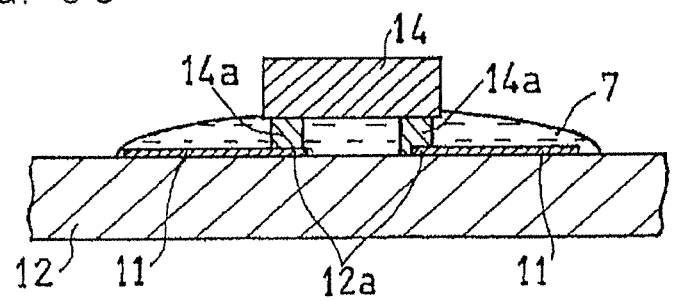
Figure 6D:
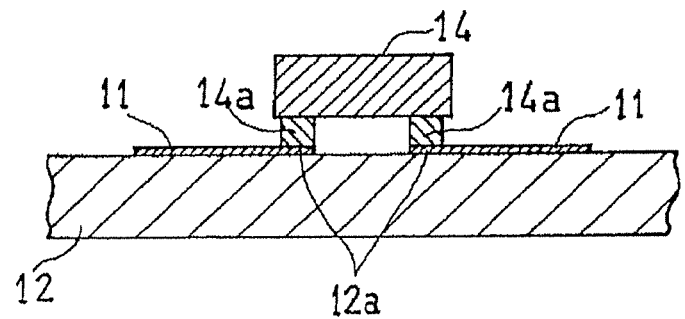
Figure 6E:
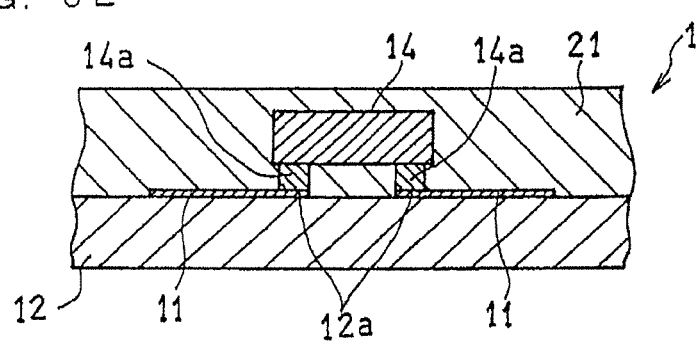

As illustrated in FIG. 6A, a plurality of wirings 11 are formed on the top surface of the substrate 12, and end portions of the wirings 11 are formed as the electrodes 12a (first electrodes). As illustrated in FIGS. 6C to 6E, a light emitting diode (LED chip), an example of the semiconductor device 14, has the bumps 14a (second electrodes) respectively connected to the electrodes. Here, the wirings 11 on the substrate 12 are made of, for example, copper (Cu), and similarly, the electrodes 12a are made of Cu. The bumps 14a of the semiconductor device 14 are made of, for example, gold (Au). As illustrated in FIG. 6A, the electrode 12a of the substrate 12 is covered with an oxide film 13. Note that in FIG. 6A, in view of visibility, the scale of the thickness of the oxide film 13 is enlarged.

(Oxide Film Removal Step)

As a preparatory step before mounting the semiconductor device 14 onto the substrate 12, plasma processing is applied to the electrodes 12a of the substrate 12 on the plasma processing stage 38, thereby to remove the oxide film 13 from the electrodes 12a (S1).

Specifically, the plasma head 36 is operated to generate atmospheric pressure plasma, while the substrate 12 is held on the plasma processing stage 38 (second substrate stage), with the electrodes 12a facing upward. The atmospheric pressure plasma generated by the plasma head 36 is irradiated to each electrode 12a of the substrate 12, via a plasma irradiation portion disposed on the underside of the plasma head 36. In that way, the oxide film 13 on the electrode 12a and on the wiring 11 in the vicinity thereof is removed. At this time, the substrate 12 is heated to a temperature of, for example, 50 to 100° C. with a heater 38a incorporated in the plasma processing stage 38 (see FIG. 4). Concurrently therewith, with respect to another substrate 12 having been subjected to plasma processing, ultrasonic joining process of the semiconductor device 14 is executed as illustrated in FIGS. 6C and 6D.

Upon completion of plasma processing, as illustrated in FIG. 4, a substrate elevating mechanism 37 provided on the plasma processing stage 38 moves the substrate 12 upward, with supporting the right and left ends of the substrate 12. The substrate 12 is thus lifted from the plasma processing stage 38, and in this state, a transfer hook 35a included in a transfer mechanism 35 is brought into contact with the front end of the substrate 12 in the X-axis direction. The transfer hook 35a pushes the substrate 12 rearward in the X-axis direction, so that the substrate 12 is pushed out toward the mounting stage 34 (first substrate stage) and transferred. Note that the transfer hook 35a is retracted to a different position, except when transferring the substrate 12.

(Auxiliary Joining Agent Dispensing Step)

Upon transferred from the plasma processing stage 38 by the transfer mechanism 35, the substrate 12 is held on the mounting stage 34. In this state, on the basis of the recognition result of the substrate recognition camera 110, the mounting stage 34 is moved by the mounting stage moving mechanism 112, so that the substrate 12 is positioned. Thereafter, an auxiliary joining agent 7 is dispensed from the auxiliary joining agent dispensing head 42 onto the wirings 11 and the electrodes 12a of the substrate 2, as illustrated in FIG. 6B (S2).

The auxiliary joining agent used here is a liquid or paste-like dye solution prepared by dissolving 5 parts by mass of Solvent Yellow 56 in 100 parts by mass of glycerin. By dispensing the auxiliary joining agent onto the electrodes 12a prior to the ultrasonic joining process, the oxide film 13 left unprocessed in the oxide film removal process, if any, can be removed. Furthermore, since the area around the contact portion between the electrode 12a and the bump 14a is covered with the auxiliary joining agent 7, a metal oxide (oxide of copper) formed during ultrasonic joining of the electrodes can be removed, and no metal oxide will exist at the joint interface between the electrodes. Upon completion of the ultrasonic joining process, the auxiliary joining agent is evaporated and removed from the joint interface and the vicinity thereof through auxiliary joining agent removal process described hereinafter.

(Semiconductor Device Supply Step)

One semiconductor device 14 is sucked up from the device supply stage 24 and held by the pickup tool 26b of the device pickup unit 26. In this state, the pickup head 26a is moved by the pickup head moving mechanism 28, and the a m 26c is half-rotated (turned by 180°) by the pickup head rotating mechanism 29. Through this operation, the semiconductor device 14 is turned upside down, and the semiconductor device 14 is carried to the delivery position P3 and delivered to the mounting tool 30a. In that way, the semiconductor device 14 is held by the mounting tool 30a (S3).

(Substrate Recognition/Auxiliary Joining Agent Remaining Amount Detection Step)

The mounting tool 30a, with holding the semiconductor device 14, moves the semiconductor device 14 above the mounting position P4 such that the bumps 14a respectively correspond to the electrodes 12a. In this state, the mounting stage 34 is moved by the mounting stage moving mechanism 112 on the basis of the recognition result of the substrate recognition camera 110, so that the substrate 12 is positioned. Concurrently therewith, the remaining amount of auxiliary joining agent is detected from the distribution state (e.g., distribution area) of the auxiliary joining agent within the image taken by the substrate recognition camera 110 (S4).

If the controller 80 determines that the remaining amount of auxiliary joining agent is sufficient, the step goes to the next ultrasonic joining step. If the controller 80 determines that the remaining amount of auxiliary joining agent is insufficient, dispensing of the auxiliary joining agent 7 by the auxiliary joining agent dispensing head 42 is performed again (S5). Thereafter, the step goes to the next ultrasonic joining step.

(Ultrasonic Joining Step)

The controller 80, after having confirmed the remaining amount of the auxiliary joining agent 7, moves the mounting head 30 downward to bring the bumps 14a into contact with the corresponding electrodes 12a such that they are pressed against each other. At this time, since the auxiliary joining agent 7 has been dispensed on each electrode 12a and the wiring 11 in the vicinity thereof, the area around the contact surface between the bump 14a and the electrode 12a is covered with the auxiliary joining agent 7 (see FIG. 6C).

In the state illustrated in FIG. 6C, ultrasonic vibration generated by the mounting head 30 is applied to the semiconductor device 14 through the mounting tool 30a. This generates friction at the contact surfaces between the bump 14a and the electrode 12a, and the bump 14a and the electrode 12a are metal-joined (i.e., ultrasonically joined) to each other (S6). Thereafter, the generation of ultrasonic vibration at the mounting head 30 is stopped, and the holding of the semiconductor device 14 by the mounting tool 30a is released. Thereafter, the mounting head 30 is lifted, and the mounting tool 30a is withdrawn from the semiconductor device 14.

Upon completion of mounting of all the semiconductor devices 14 onto the substrate 12, the step goes to the next auxiliary joining agent removal step ("Yes" in S7). If the mounting of all the semiconductor devices 14 onto the substrate 12 is not yet completed ("No" in S7), the step goes back to the step S2, the auxiliary joining agent is dispensed to the next mounting position of the substrate 12, and the step S3 and subsequent steps are repeated.

(Auxiliary Joining Agent Removal Step)

Next, the removal of the auxiliary joining agent 7 remaining between the substrate 12 and the semiconductor device 14 is performed (S8). Specifically, the substrate 12 is heated by the heater 34a via the mounting stage 34, by which the evaporation of the auxiliary joining agent 7 is facilitated and the auxiliary joining agent 7 is removed. Alternatively, the evaporation of the auxiliary joining agent 7 may be facilitated by blowing hot air thereto using a fan (not shown). Through the step above, as illustrated in FIG. 6D, the auxiliary joining agent 7 remaining between the substrate 12 and the semiconductor device 14 is removed.

Note that since the purpose of the auxiliary joining agent removal step is to remove the auxiliary joining agent remaining after the ultrasonic joining step, in advance of the resin encapsulation step described below, the necessity of performing the auxiliary joining agent removal step may be examined depending on the remaining amount of the auxiliary joining agent, and if not necessary, the auxiliary joining agent removal step may be omitted.

(Resin Eencapsulation Step)

Next, portions including the joint portion between the substrate 12 and the semiconductor device 14 are encapsulated with resin, thereby to complete a semiconductor device-mounted substrate 1 (S9). Specifically, a resin 21 is applied by the resin dispensing head 72 so as to cover the surfaces of the wirings 11, electrodes 12a, and bumps 14a, including the joint portion between the electrode 12a and the bump 14a. In that way, as illustrated in FIG. 6E, the space between the semiconductor device 14 and the substrate 12 is sealed with the resin 21. When the semiconductor device 14 is a light emitting diode, it is preferable to use an optically transparent resin as the resin 21.

As described above, in ultrasonic joining, ultrasonic vibration is applied to the semiconductor device 14, with the bump 14a being pressed against the electrode 12a. Due to the frictional heat, the contact portion between the bump 14a and the electrode 12a is locally heated to a high temperature. Therefore, for example, in the case where the electrode 12a contains Cu, even if the contact surface of the electrode 12a with the bump 14a is oxidized, since the area around the frictional surface is covered with the auxiliary joining agent with reducing property, the formation of metal oxide can be suppressed, and the entry of metal oxide into the joint interface can be prevented. This can ensure sufficient joint strength. At this time, the reduction reaction by the auxiliary joining agent 7 is promoted by the frictional heat as mentioned above. Therefore, the formation of metal oxide during ultrasonic joining can be more effectively suppressed. Furthermore, since in the oxide film removal step, the surface oxide film is removed through plasma processing in which the processing amount can be easy controlled, it is highly unlikely that the joint reliability is reduced due to insufficient removal of the oxide film.

In the case of mounting a plurality of the semiconductor devices 14 onto the substrate 12, the auxiliary joining agent 7 may be dispensed onto the substrate 12 so as to cover the electrodes 12a corresponding to the plurality of the semiconductor devices 14 in the auxiliary joining agent dispensing step (S2). Note that, however, in the substrate recognition/auxiliary joining agent remaining amount detection step (S4), if the remaining amount of auxiliary joining agent is checked every time when the semiconductor device is mounted, improvement in efficiency of the mounting process may difficult to achieve.

Figure 7:
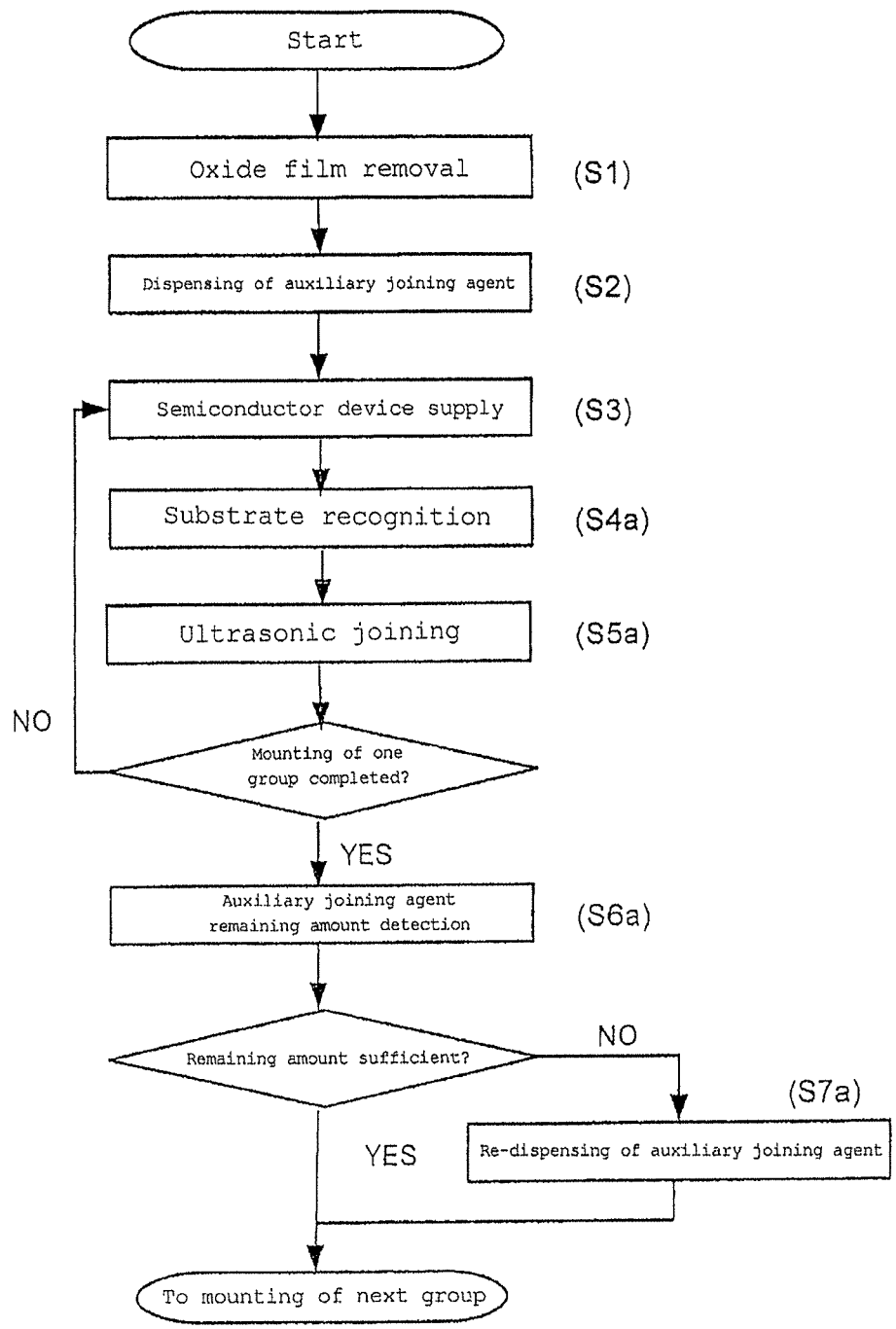

In view of this, as shown in the flowchart of FIG. 7, a plurality of the semiconductor devices 14 are divided into a certain number of groups, and with respect to each group, the supply of the semiconductor device 14 (S3), the substrate recognition for aligning the substrate 12 and the semiconductor device 14 with each other (S4a), and the mounting of the semiconductor device 14 (S5a) are repeated a plurality of times. Every time when the mounting of one group of the semiconductor devices 14 is completed, the remaining amount of auxiliary joining agent is detected (S6a). For example, given that two hundred semiconductor devices 14 are to be mounted onto the substrate 12, every time when the mounting of one hundred semiconductor devices 14 is completed, the remaining amount of auxiliary joining agent covering the rest of the electrodes 12a is detected.

If the amount of auxiliary joining agent remaining around the semiconductor device 14 mounted immediately before is judged as sufficient, the process goes to the mounting of the next group. On the other hand, if the remaining amount of auxiliary joining agent around the semiconductor device 14 mounted immediately before is judged as insufficient, there is a possibility that the auxiliary joining agent becomes insufficient when mounting the rest of the semiconductor devices 14. Therefore, the auxiliary joining agent 7 is re-dispensed from the auxiliary joining agent dispensing head 42 onto the electrodes 12a not yet subjected to mounting (S7a). Thereafter, the supply of a next group of the semiconductor devices 14 (S3), the substrate recognition for aligning the substrate 12 and the semiconductor device 14 with each other (S4a), and the mounting of the semiconductor device 14 (S5a) are repeated until all the semiconductor devices 14 in the group are mounted. At the timing when the mounting of the group of the semiconductor devices 14 is completed, the remaining amount of auxiliary joining agent is detected.

As described above, according to the present invention, since a colored auxiliary joining agent is used, the amount of auxiliary joining agent present on the substrate can be easy identified with a recognition device (inspection unit) included in the mounting machine. Therefore, the dispensing amount of auxiliary joining agent onto the substrate can be easily stabilized, and thus, the semiconductor device is prevented from being mounted under the condition where the auxiliary joining agent is insufficient. In addition, since the presence of auxiliary joining agent can be identified visually, even though the auxiliary joining agent having volatilized unexpectedly adheres to the inside of the mounting machine, the maintenance of the mounting machine can be easily performed.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

INDUSTRIAL APPLICABILITY

The present invention is useful in the field of semiconductor device mounting in which Au—Cu joining or Cu—Cu joining is performed, particularly in the field of flip-chip mounting.

REFERENCE SIGNS LIST

7: Auxiliary joining agent, 10: Mounting machine, 12: Substrate, 12a: First electrode, 14: Semiconductor device, 14a: Bump, 16: Mounting unit, 18: Semiconductor device supply unit, 20: Plasma processing unit, 22: Auxiliary joining agent dispenser unit, 30: Mounting head, 35: Transfer mechanism, 36: Plasma head, 42: Auxiliary joining agent dispensing head.

The invention claimed is:

1. A mounting method of a semiconductor device, the method comprising the steps of:
preparing a colored auxiliary joining agent having a reducing property of removing an oxide film on a metal surface;
allowing a substrate having a first electrode to be held on a substrate stage, with the first electrode facing upward;
providing the auxiliary joining agent onto the substrate held on the substrate stage, so as to cover the first electrode; and,
mounting the semiconductor device onto the substrate by pressing a second electrode of a supplied semiconductor device against the first electrode of the substrate which is held on the substrate stage and has the auxiliary joining agent dispensed on the first electrode, to join the first electrode and the second electrode to each other, the auxiliary joining agent comprises a solvent having a reducing property of removing an oxide film on the metal surface, and a colorant having a property of dissolving in the solvent;

the solvent includes a multi-functional alcohol having a molecular weight of 50 to 200; and the colorant has a property of volatilizing along with the solvent.

2. The mounting method of a semiconductor device according to claim 1, wherein the solvent has a boiling point Tb, and the colorant has a melting point Tm, Tb and Tm satisfying Tb>Tm in the auxiliary joining agent; and the auxiliary joining agent is produced by a method including a step of mixing the solvent and the colorant, and simultaneously heating the solvent and the colorant mixed together, at a temperature lower than the boiling point Tb of the solvent and higher than the melting point Tm of the colorant.

3. The mounting method of the semiconductor device according to claim 1, wherein a mixture of the solvent and the colorant includes an amphiphilic substance with respect to the solvent and the colorant.

4. The mounting method of the semiconductor device according to claim 1, wherein the substrate includes a plurality of the first electrodes;

the step of providing the auxiliary joining agent includes a step of providing the auxiliary joining agent to cover the plurality of the first electrode;

in the step of mounting the semiconductor device onto the substrate, processes of joining the first electrode and the second electrode to each other by pressing the second electrode against the first electrode perform one after another with respect to a plurality of semiconductor devices;

the step of mounting the plurality of semiconductor devices onto the substrate includes a step of detecting a remaining amount of the auxiliary joining agent provided onto the substrate, every time when mounting of two or more selected from the plurality of the semiconductor devices is completed; and, the auxiliary joining agent is re-provided onto the substrate if the remaining amount of the auxiliary joining agent is judged as insufficient in the step of detecting the remaining amount.

5. The mounting method of the semiconductor device according to claim 1, wherein the first electrode and the second electrode are joined by ultrasonic.

6. The mounting method of the semiconductor device according to claim 1, wherein the substrate stage includes a function of heating the substrate.

* * * * *